(12) United States Patent
Hogl et al.

(10) Patent No.: US 6,188,286 B1
(45) Date of Patent: Feb. 13, 2001

(54) METHOD AND SYSTEM FOR SYNCHRONIZING MULTIPLE SUBSYSTEMS USING ONE VOLTAGE-CONTROLLED OSCILLATOR

(75) Inventors: Erik Hogl; Ulrich Fiedler, both of Santa Clara, CA (US)

(73) Assignee: Infineon Technologies North America Corp., San Jose, CA (US)

( * ) Notice: Under 35 U.S.C. 154(b), the term of this patent shall be extended for 0 days.

(21) Appl. No.: 09/450,818

(22) Filed: Nov. 29, 1999

Related U.S. Application Data

(60) Provisional application No. 60/126,863, filed on Mar. 30, 1999.

(51) Int. Cl.⁷ ............... H03L 7/00; H03L 7/06; G06K 1/12; H03K 3/00
(52) U.S. Cl. ............... 331/2; 331/1 A; 331/173; 327/142; 327/147; 327/151; 327/153; 327/295; 327/297
(58) Field of Search ............... 331/1 A, 2, 18, 331/25, 47, 173; 327/144–151, 153, 142, 156–163, 291, 293, 295, 297

(56) References Cited

U.S. PATENT DOCUMENTS

| | | |
|---|---|---|
| 4,282,493 | 8/1981 | Moreau . |
| 4,868,513 | 9/1989 | Piercy et al. . |
| 5,056,118 | 10/1991 | Sun . |
| 5,142,246 | 8/1992 | Petersson . |
| 5,148,334 | 9/1992 | Takeuchi et al. . |
| 5,172,357 | 12/1992 | Taguchi . |
| 5,228,138 | 7/1993 | Pratt et al. . |
| 5,239,215 | 8/1993 | Yamaguchi . |
| 5,315,183 | 5/1994 | Ruotsalsinem . |
| 5,570,053 | 10/1996 | Takla . |
| 5,627,482 | 5/1997 | Lamatsch . |
| 5,668,830 | 9/1997 | Georgiou et al. . |
| 5,742,799 | 4/1998 | Alexander et al. . |
| 6,018,273 | * 1/2000 | Tsyrganovich ............... 331/2 |

FOREIGN PATENT DOCUMENTS

| | | |
|---|---|---|
| 0 067 053 A1 | 6/1982 | (EP) . |
| 0 125 768 A2 | 3/1984 | (EP) . |
| 0 282 735 A2 | 2/1988 | (EP) . |
| 1 593 810 | 4/1978 | (FR) . |
| 2 000 651 | 5/1978 | (GB) . |
| 2 311 881 | 4/1996 | (GB) . |
| WO 94/24793 A1 | 10/1994 | (WO) . |

OTHER PUBLICATIONS

Search Report, Application No. GB 0004698.7, Date of Search: May 31, 2000.

* cited by examiner

Primary Examiner—David Mis

(57) ABSTRACT

A method for synchronizing multiple subsystems using one voltage-controlled oscillator. The method includes transmitting a phase and frequency aligned output of a voltage-controlled oscillator to each subsystem within a digital system. A first subsystem of the multiple subsystems generates a first internal clock and outputs a synchronization signal to each of the other subsystems. The synchronization signal has a marker that defines a known point in time of the first internal clock. The other subsystems sample the synchronization signal using the output signal of the voltage controller oscillator to determine a starting indicator that indicates the known point in time of the first internal clock. Upon detection of the marker in the synchronization signal, the other subsystems starts a second internal clock that is synchronized with the first internal clock.

8 Claims, 5 Drawing Sheets

METHOD AND SYSTEM FOR SYNCHRONIZING MULTIPLE SUBSYSTEMS USING ONE VOLTAGE-CONTROLLED OSCILLATOR

This application claims benefit to U.S. provisional 60/126,863 filed Mar. 30, 1999.

FIELD OF THE INVENTION

The present invention relates generally to clock synchronization, and more specifically to clock synchronization using one voltage-controlled oscillator for synchronizing multiple chips or subsystems.

BACKGROUND OF THE INVENTION

As the operating frequency of complex digital communication and data transfer systems increase, there is major challenge to operate the entire digital system in a synchronous manner. Typically, a complex digital system includes various chips each having circuitry associated with one subsystem that needs to exchange information with other subsystems. The exchange of information between the various subsystems must be synchronized in order to prevent loss or corruption of the exchanged information.

For example, if the complex digital system operates in an Asynchronous Transfer Mode (ATM) network, each subsystem may be responsible for extracting a data signal from one of several cells. The data signal may represent voice, video or any other type of synchronous signal. Briefly, ATM is a standard that describes the process for packetizing a synchronous signal into a cell so that voice, video, data or other information may be sent over the same network. Each cell has a fixed size and includes a header and a payload. The synchronous signal information is placed in the payload of a cell and the cell is interleaved with cells from other sources. These cells are then delivered to a destination. At the destination, individual cells are extracted to reconstruct the original synchronous signals.

As mentioned earlier, typically, one subsystem is responsible for reconstructing one of the original synchronous signals from the packetized cells. Therefore, each subsystem must be synchronized with the other subsystems so that the data from the various signals is not corrupted as a result of clock skew between the subsystems. The problem with clock skew (i.e. phase difference) between the reference clocks for the various subsystems becomes even greater as the internal operating frequencies increase above several hundred megahertz (MHz). Therefore, with the increasing desire for greater internal operating frequencies, a synchronization scheme with a high degree of synchronization among the subsystems becomes increasingly important.

One prior art synchronization scheme has a phase alignment circuit for each subsystem. FIG. 1 is a functional block diagram of a prior art phase alignment circuit 10. The phase alignment circuit 10 includes a phase detector 12, a loop filter 14 and a voltage-controlled oscillator (VCO). The loop filter 14 is connected to an output signal V_VCO of the phase detector 12 and a control input of the VCO. The phase detector 12 has two inputs: a reference signal C_SYS and an output signal connected directly or indirectly from the VCO. As one skilled in the art will appreciate, the VCO may generate the output signal C_VCO to be any frequency that is a multiple of the C_SYS signal. For example, the C_SYS signal may be at 8 MHz and the VCO may generate the signal C_VCO at 32 MHz. The higher frequency C_VCO signal is then used internally as a clock for the subsystem.

If the C_VCO signal is at a higher frequency then the reference signal C_SYS, the C_VCO signal is input to a divider 16 to produce a signal C_SYS_INT having the same frequency as reference signal C_SYS. The output of the divider 16 is then directly connected to the phase detector 12 instead of having the signal C_VCO directly connected from the VCO. For the remaining of the disclosure, the signal C_SYS_INT will be used to refer to the input to the phase detector 12.

In operation, the phase detector 12 compares the phase of the reference signal C_SYS against the phase of the signal C_SYS_INT produced by the VCO. The difference voltage signal V_VCO generated by the phase detector 12 is a measure of the phase difference between the two input signals, C_SYS and C_SYS_INT. The difference voltage signal V_VCO is filtered by the loop filter 14 to produce a control voltage which is then applied to the VCO. Application of the control voltage to the VCO changes the frequency of the output signal C_VCO produced by the VCO in a direction that reduces the phase difference between the input signal C_SYS_INT and the reference signal C_SYS.

FIG. 2 is a timing diagram of the phase alignment or convergence of C_SYS_INT with C_SYS in the phase alignment circuit 10 shown in FIG. 1 at three different lock-in phase states: 0 degree phase difference; 90 degree phase difference; and 180 degree phase difference. In general, one skilled in the art will appreciate that for each starting state, as the average voltage increases, the loop filter 14 produces a control voltage that causes the VCO to change the frequency F_CVO of the output signal C_VCO to reduce the phase difference between the two input signals of the phase detector 12. Once the signals are phase aligned, the signals are then in one of the lock-in states illustrated in FIG. 2.

Typically, as mentioned earlier, a complex digital system may have several subsystems that need to be phase aligned with the reference signal C_SYS. Therefore, in this prior art system, each subsystem has a dedicated VCO and a phase alignment circuit 10 to synchronize the C_SYS_INT signal in each subsystem. Having a VCO and a phase detection mechanism for each subsystem requires a large amount of board space and increases the costs associated with the digital system. In addition, the quality of the reconstructed synchronous signals in the digital system may be lower due to the interference and noise caused by multiple voltage-controlled oscillators (VCOs) operating in close proximity.

Accordingly, there is a present need in the art for a synchronization scheme for multiple chip configurations that minimizes board space and provides a stable synchronized signal for reconstructing signals with high quality.

SUMMARY OF THE INVENTION

The present invention overcomes the limitations identified above by providing a method and system for synchronizing multiple chips or subsystems using only one voltage-controlled oscillator. An external system clock is applied to one of the subsystems that is designated as a master. The master includes a voltage-controlled oscillator (VCO) that produces a VCO clocking signal having a frequency that is a multiple of the external system clock and is phase aligned therewith. An internal clock signal is produced within the master having a frequency equal to the external system clock and is phase aligned with the VCO clocking signal. The master generates a synchronization signal that marks a predefined edge of the internal clock signal.

To synchronize all the subsystems, the VCO clocking signal is supplied to each subsystem so that it arrives with the same phase. In addition, the synchronization signal is supplied to each subsystem which samples the synchronization signal with an edge of the VCO clocking signal to determine when the predefined edge of the internal clock signal of the master has occurred. Because the internal clock signal has a frequency that is a known fraction of the VCO clocking signal, the subsystem delays for a predefined number of period of the VCO clocking signal before realigning its own internal clocking signal. As a result, the internal clock signal of the salve subsystem is synchronized with the internal clock of the master.

Because the first internal clock and the second internal clock are synchronized, all the subsystems clock incoming data at an identical time. Therefore, the present invention achieves synchronized operation between multiple subsystems using only one voltage-controlled oscillator. Consequently, the present invention reduces the cost and the board space for any digital system in comparison with the synchronization schemes in the prior art.

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE PREFERRED EMBODIMENT

Figure 3:
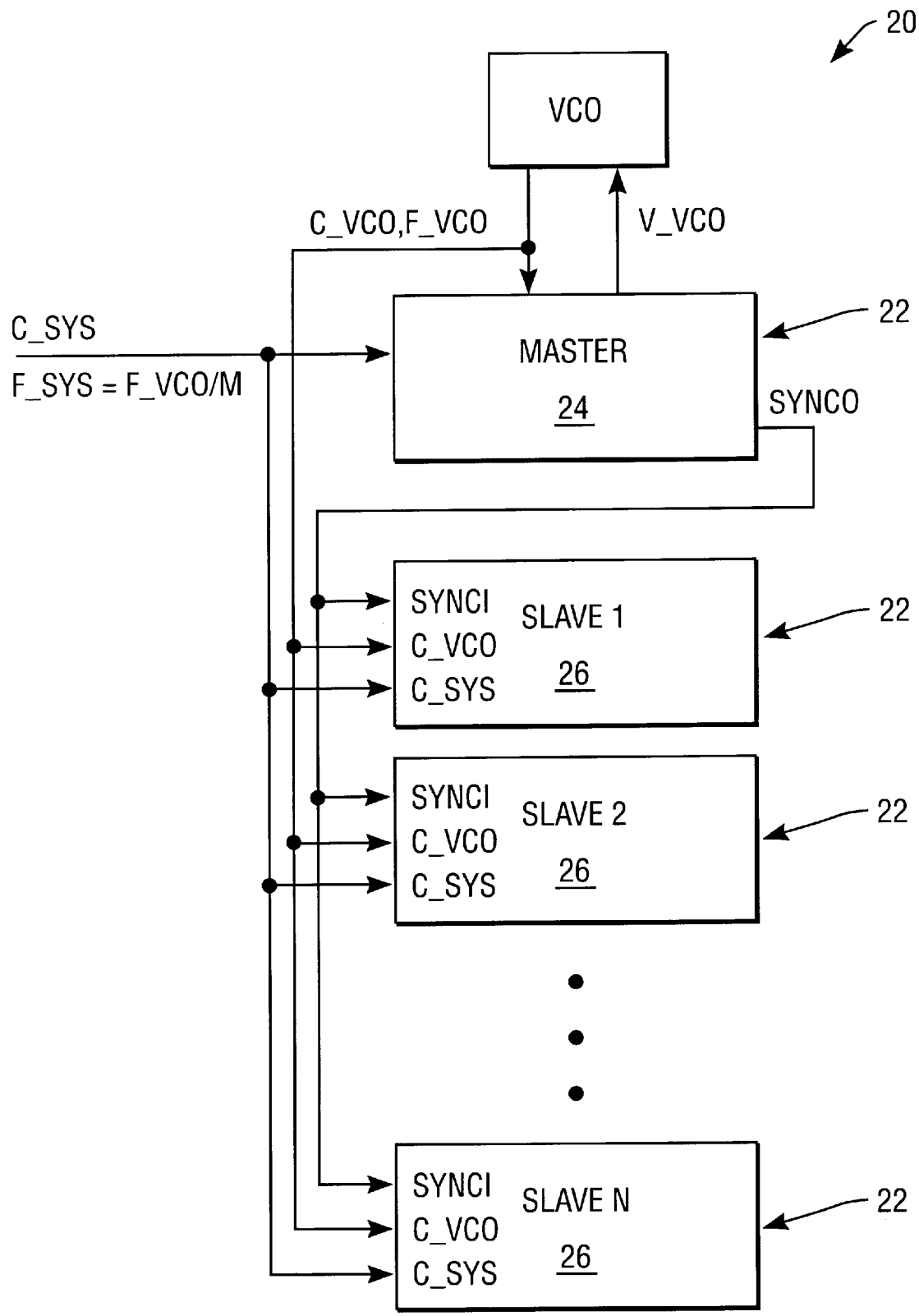
FIG. 3 is a functional block diagram of a digital system comprising a plurality of subsystems and one voltage-controlled oscillator for generating a synchronization pulse for synchronizing the subsystems according to the present invention.

FIG. 3 is a functional block diagram of a digital system 20 that requires a plurality of subsystems 22 to have individual internal clocks (not shown) that are all synchronized so that data (not shown) will be identically clocked in each subsystem 22 to avoid data corruption while extracting signals from multiplexed signals. The digital system 20 comprises a plurality of subsystems 22 and one voltage-controlled oscillator (VCO) to synchronize the 0-N subsystems 22. It should be noted that like elements are indicated by the same reference numerals throughout the disclosure. One of the subsystems 22 is designated as a master device 24 responsible for generating a synchronization pulse SYNCO. The generation of the synchronization pulse SYNCO will be described in detail later. The master device 24 is electrically coupled to a VCO that produces an output signal C_VCO having a frequency F_VCO. In general, the master device 24 has two input signals: a reference signal C_SYS and the signal C_VCO produced by the VCO. After phase aligning the output signal C_VCO with the signal C_SYS, the master device 24 generates the synchronization pulse SYNCO that is provided as an input to each of the other subsystems 22. These other subsystems 22 are thus designated as slave devices 26. As illustrated in FIG. 3, each slave device 26 has three input signals: the synchronization pulse SYNCO generated in the master device 24; the C_VCO signal produced by the VCO; and the reference signal C_SYS.

In one embodiment, the digital system 20 illustrated in FIG. 3 may represent a system in which each of the subsystems 22 is responsible for processing one of several timeslots associated with a cell on an ATM network. However, the present invention is applicable to any synchronized digital system that extracts signals that have been multiplexed using various signal techniques, such as using Time Division Multiplexed (TDM) or Pulse Code Modulation (PCM) signal techniques for multiplexing a single channel on T-1 or T-3 carriers. Any of these systems require a synchronization scheme to synchronize the various subsystems so that data is not lost or corrupted. The present invention achieves this synchronization by using the synchronization pulse SYNCO generated in the master device 24 to generate a signal $C\_SYS\_INT_{SLAVE}$ (not shown) in the slave device 26 that is synchronized with the signal $C\_SYS\_INT_{MASTER}$ (not shown). The generation of the synchronization signal SYNCO is now described in detail.

Figure 1:
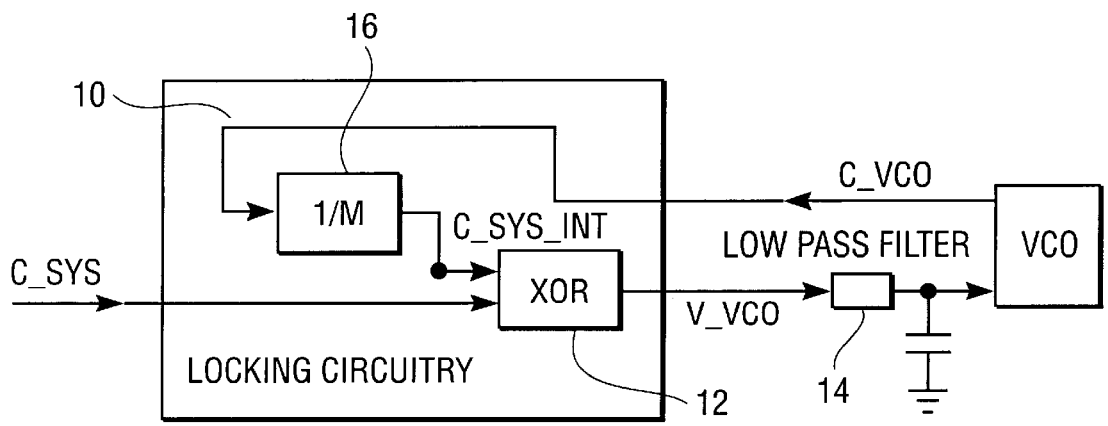
FIG. 1 is a functional block diagram of a prior art phase alignment circuit.
Figure 2:
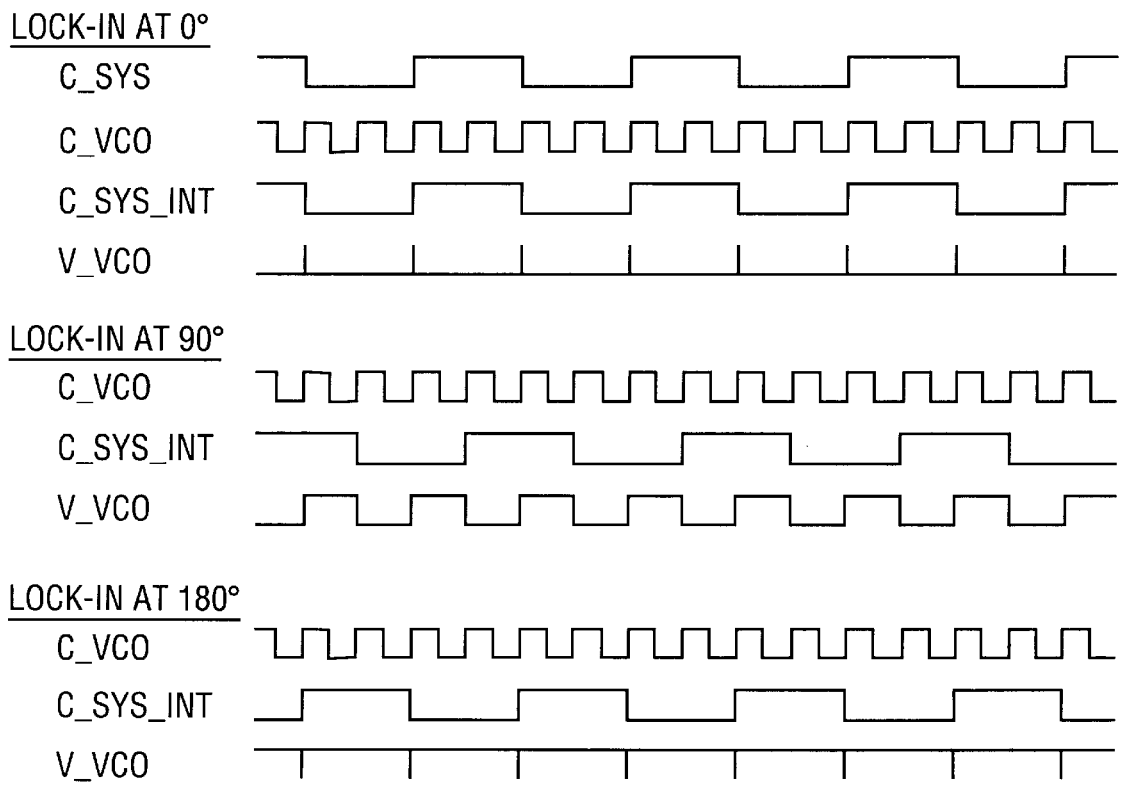
FIG. 2 is a timing diagram of the phase alignment circuit illustrated in FIG. 1 at three different lock-in states.
Figure 4:
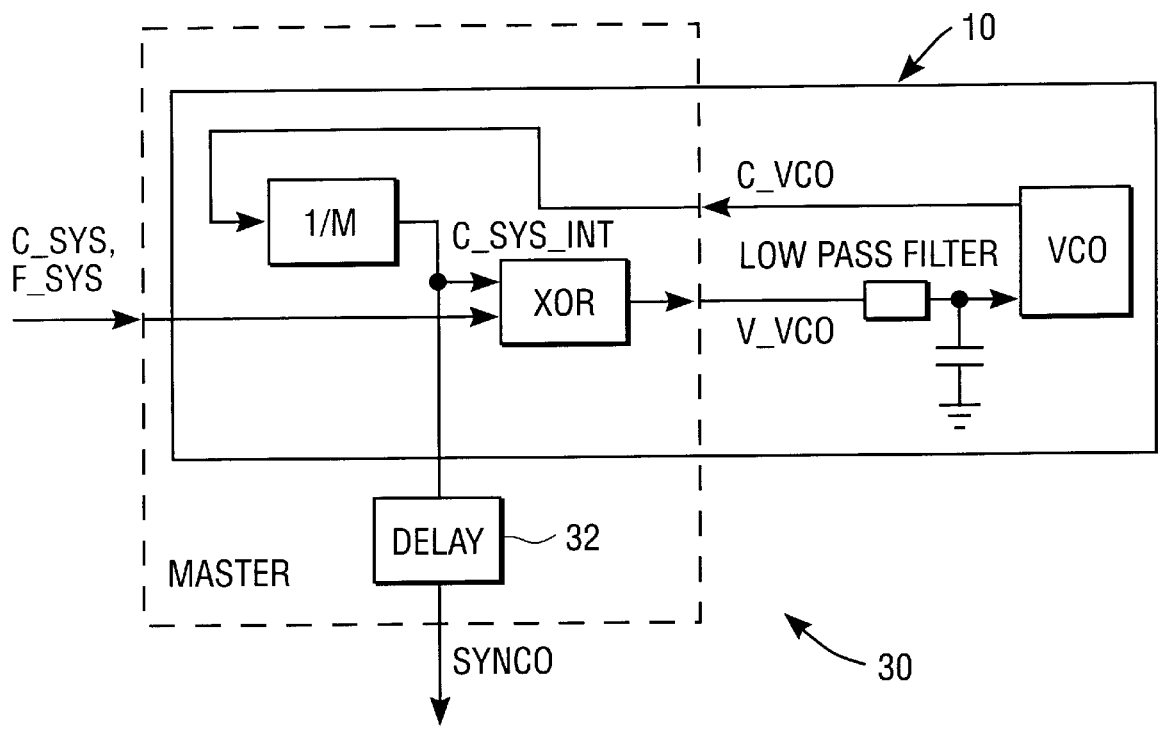
FIG. 4 is a functional block diagram of a synchronization pulse generation circuit of the digital system illustrated in FIG. 3.

FIG. 4 is a functional block diagram of a synchronization signal generation circuit 30 of the digital system 20 illustrated in FIG. 3. The synchronization signal generation circuit 30 may include a phase alignment circuit 10 as discussed in FIG. 1 or any other phase alignment circuit well known within the art. In addition, the synchronization signal generation circuit 30 may include a delay 32 that delays the signal $C\_SYS\_INT_{MASTER}$ to produce the synchronization signal SYNCO. Typically, the delay 32 results from skew caused by the electrical characteristics of the interconnecting components on the integrated circuit. The synchronization signal SYNCO has a pulse that occurs periodically as a multiple of the inverse of the reference frequency (i.e. 1/F_SYS). In one embodiment, the signal SYNCO has a period equivalent to a duration of k timeslots (e.g., cells) in a packetized data stream. The k timeslots may corrrespond to k synchronized data streams.

Figure 5:
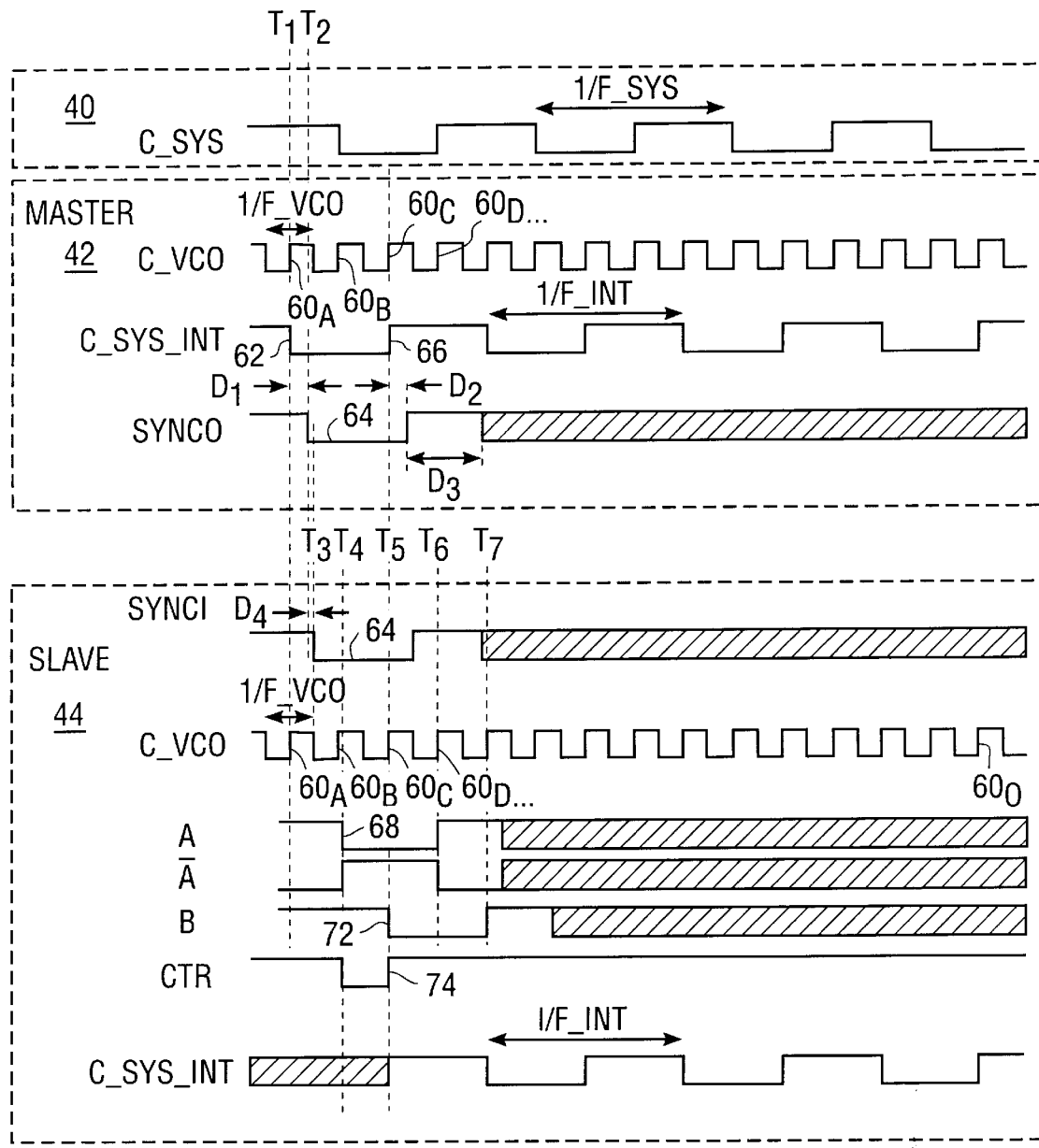
FIG. 5 is a timing diagram of the essential signals for synchronizing the subsystems illustrated in FIG. 4.

FIG. 5 is a timing diagram of the essential signals for synchronizing the subsystems illustrated in FIG. 3. In general, the present invention provides a method and system for synchronizing the signal $C\_SYS\_INT_{MASTER}$ with $C\_SYS\_INT_{SLAVE}$ using only one voltage-controlled oscillator. The output signal C_VCO of the voltage-controlled oscillator is input to the master device and the slave devices in a phase aligned manner. A synchronization signal SYNCO representing a delayed half-period of the $C\_SYS\_INT_{MASTER}$ is generated in the master device and provided to each of the slave devices with various delays due to different propagation delays between each individual subsystem. Using the phase aligned signal C_VCO, each slave device samples the synchronization signal on the rising edge of the signal C_VCO in order to detect a synchronization pulse. Because the total delay from the falling edge of $C\_SYS\_INT_{MASTER}$ in the master device to the receipt of the signal SYNCI in the slave device is less than one C_VCO period, the circuitry within the slave device determines a starting time for the signal $C\_SYS\_INT_{SLAVE}$ based on a frequency multiplier between $C\_SYS\_INT_{MASTER}$ and C_VCO. After a certain number of periods of C_VCO, the circuitry within the slave devices begins generating the $C\_SYS\_INT_{SLAVE}$ that is then synchronous with $C\_SYS\_INT_{MASTER}$. The details of this timing is illustrated in FIG. 5 for an embodiment in which the frequency multiplier is two.

In FIG. 5, the vertical dashed lines indicate particular times of interest, as described below. There are three sets of timing signals: the reference signal C_SYS, designated by reference numeral 40; a set of signals in the master device, designated by reference numeral 42; and a set of signals in the slave device, designated by reference numeral 44. As mentioned earlier, the reference signal C_SYS is a periodic signal provided by an external system interface which is provided to each subsystem in a phase aligned manner. The reference signal C_SYS may be used in a first stage of a two stage sampling circuit for clocking input data. The second stage uses the signal C_SYS_INT which will be discussed in detail below.

First, the set of master device signals 40 for generating the synchronization signal SYNCO will now be described in relation to the reference signal C_SYS. As mentioned earlier, the master device 24 generates the internal signal C_SYS_INT and the synchronization signal SYNCO based on the input reference signal C_SYS and input C_VCO from the VCO. As mentioned above, the frequency multiplier for the embodiment corresponding to the timing diagram shown in FIG. 5 is four. Consequently, the VCO outputs C_VCO at four times the frequency of C_SYS. As explained above, the phase alignment circuit 10 ensures that the signal C_SYS_INT is phase and frequency aligned with C_SYS. In the illustrated timing diagram, the signal C_SYS_INT and signal C_SYS have a 90° lock-in phase alignment. Correspondingly, the signal C_VCO, which is used to produce the signal C_SYS_INT, is also phase aligned with C_SYS but has a different frequency. As mentioned earlier, the frequency F_VCO of C_VCO is typically a multiple of the system clock frequency F_SYS. In the timing diagram, at time $T_1$ a rising edge 60A of signal C_VCO initializes a counter that derives C_SYS_$INT_{MASTER}$ from C_VCO. One skilled in the art will appreciate that the falling edge of signal C_VCO may also serve to initialize the counter for deriving C_SYS_$INT_{MASTER}$ from C_VCO.

At time $T_2$, the synchronization signal SYNCO is generated after a first delay $D_1$ in response to the falling edge 62 of signal C_SYS_$INT_{MASTER}$. The synchronization signal SYNCO remains low until a second delay $D_2$ after the rising edge 66 of signal C_SYS_$INT_{MASTER}$. The low pulse of the synchronization signal SYNCO is hereinafter referred to as a synchronization pulse 64 that has a duration equal to one-half a period of C_SYS_$INT_{MASTER}$. Delay $D_1$ and $D_2$ are due to line drivers and other inherent characteristics of electrical signals well known within the art. A fixed hold time $D_3$ allows adequate time for detecting the rising edge 66 of C_SYS_$INT_{MASTER}$. After the hold time $D_3$, the state of the synchronization signal SYNCO is not relevant until a predetermined time lapses and the circuitry in the master device 24 enables the generation of another valid synchronization pulse 64. The predetermined time extends for a duration equal to some multiple of the inverse reference frequency (1/F_SYS). In one embodiment, the predetermined time extends for a duration of k timeslots (e.g., cells) in the packetized stream. The k timeslots may correlate with N subsystems that will extract the k synchronous signals from the packetized stream.

The set of slave device signals 44 for synchronizing the C_SYS_$INT_{SLAVE}$ with C_SYS_$INT_{MASTER}$ in the master device 24 will now be described. At time $T_3$, the synchronization signal SYNCO from the master device 24 is input to one of the slave devices 26 as signal SYNCI having a delay $D_4$ from the signal SYNCO. As one skilled in the art will appreciate, the delay $D_4$ for each slave device may be different due to propagation delays between the master device and the corresponding slave device. Even though each slave device may receive the synchronization signal SYNCO at a different time, the present invention provides a synchronization scheme that generates the signal C_SYS_$INT_{SLAVE}$ for each slave device to be phase and frequency aligned with the signal C_SYS_$INT_{MASTER}$ generated in the master device 24. One embodiment of the synchronization scheme in relation to the slave device 26 is described in detail below.

Figure 6:
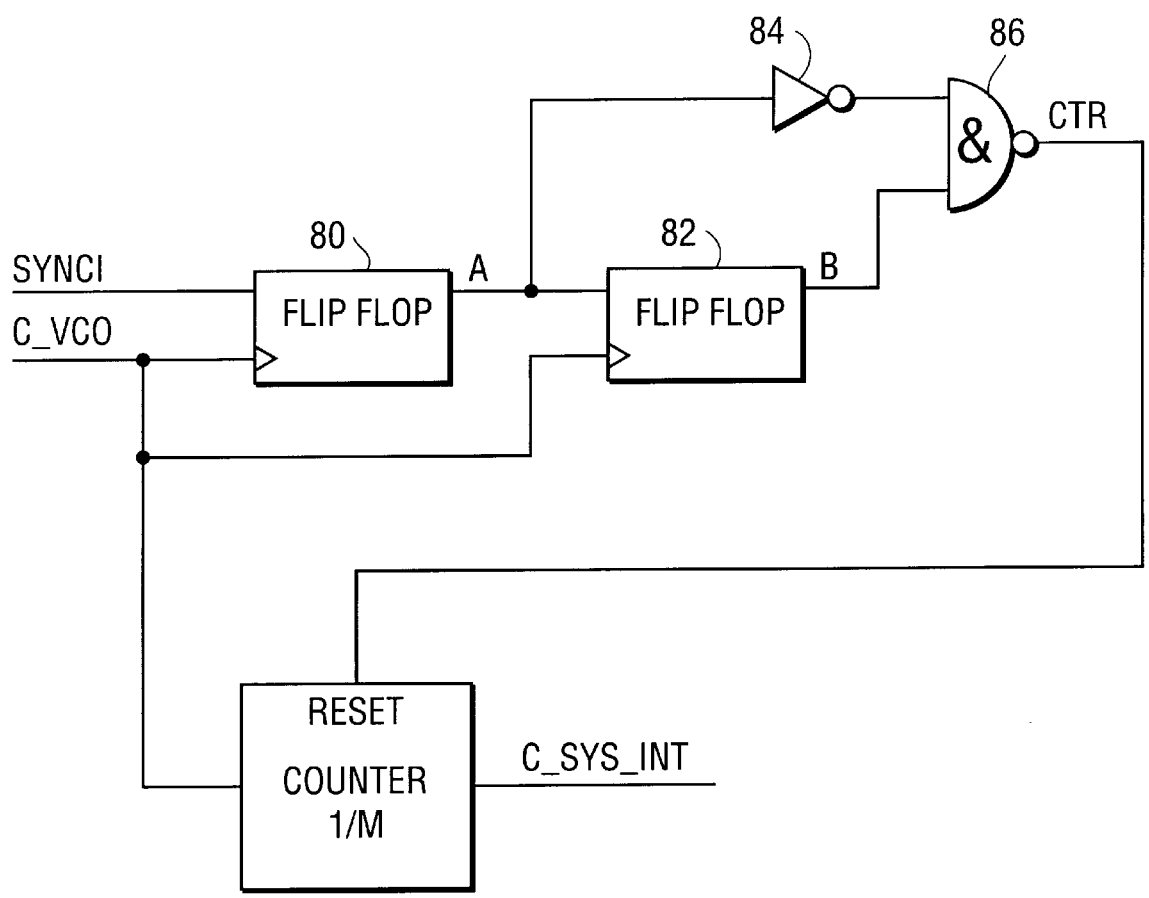
FIG. 6 is a schematic of a synchronization circuit constructed in accordance with the present invention.

FIG. 5, taken in conjunction with FIG. 6, illustrates one embodiment of the synchronization scheme of the present invention. In general, as illustrated in FIG. 5, the C_$VCO_{MASTER}$ and the C_$VCO_{SLAVE}$ are frequency and phase aligned at 0°. The technique for laying out a board to insure that these two signals are phase aligned at 0° is well known in the art and will not be discussed in further detail. Because C_$VCO_{MASTER}$ and C_$VCO_{SLAVE}$ are phase aligned at 0°, the following discussion refers to either signals as C_VCO.

The synchronization signal SYNCI is sampled on each rising edge $60_{A-O}$ of C_VCO. As illustrated, at time $T_1$ on the rising edge $60_A$ of C_CVO, the synchronization signal SYNCI is high and at time $T_4$, on the rising edge $60_B$ of C_VCO, the synchronization signal SYNCI is low, corresponding to the synchronization pulse 64. Once the sampling indicates that the synchronization signal SYNCI is low, circuitry within the slave device 26 deasserts a signal A on the same rising edge $60_B$ of C_VCO that detected SYNCI as low, see time $T_4$. The slave circuitry then reasserts signal A based on the frequency multiplier discussed above. In the embodiment shown, the frequency multiplier is two so the circuitry reasserts signal A on the second rising edge $60_D$ of C_VCO as shown at time $T_6$. Signal A is delayed for one period of signal C_VCO to produce signal B, see times $T_5$ to $T_7$ corresponding to the rising edges $60_C$ and $60_E$ of C_CVO. Based on the signals A and B, the slave circuitry generates an internal counter alignment signal CTR that represents an inverted pulse that signals a starting time for generating C_SYS_$INT_{SLAVE}$. The rising edge 74 of signal CTR at time $T_5$ validates the signal C_SYS_$INT_{SLAVE}$ which then is clocked as a periodic signal using the frequency multiplier to determine which rising edge 60 of C_VCO to use. Thus, as shown in FIG. 5, C_SYS_$INT_{MASTER}$ and C_SYS_$INT_{SLAVE}$ are synchronized at time $T_5$.

FIG. 6 is a schematic of one embodiment of the present invention illustrating a synchronization circuit 78 for a slave device 26. The inputs and output of the synchronization circuit 78 correspond to the inputs and output of the slave device 26 shown in FIG. 3. The synchronization circuit 78 is responsible for generating the signal C_SYS_$INT_{SLAVE}$ that is phase aligned and frequency aligned with C_SYS_$INT_{MASTER}$ in response to the synchronization signal SYNCO received from the master device 24.

Describing now the operation of the circuit, a first flop 80 receives the input signals SYNCI and C_VCO. As described above, the signal SYNCI is the delayed signal SYNCO from the master device. On the rising edge of signal C_VCO, the flip flop 80 samples SYNCI and outputs the sampled state of SYNCI as signal A. In the timing diagram of FIG. 5, times $T_1$ and $T_4$ are examples of sampling times performed by the flip flop 80. A second flip flop 82 samples signal A on the rising edge of C_VCO and outputs signal B (shown as time $T_4$ in FIG. 5). Therefore, as described above, signal B is signal A delayed by one C_VCO period. Signal A is then inverted through inverter 84 and anded with the signal B in NAND gate 86. When both the inverted signal A and signal B are high, NAND gate 86 outputs a low, corresponding to signal CTR at times $T_4$ to $T_5$ in FIG. 5. A low on CTR sets a counter 88 to output a valid signal $C\_SYS\_INT_{SLAVE}$, corresponding to the rising edge 74 of the signal CTR shown in FIG. 5. Because the input signal C_VCO is already phase and frequency aligned with C_VCO in the master device, the counter 88 generates output signal $C\_SYS\_INT_{SLAVE}$ to be at the same frequency as $C\_SYS\_INT_{MASTER}$ which results in $C\_SYS\_INT_{SLAVE}$ being synchronized with $C\_SYS\_INT_{MASTER}$. Thus, as shown in FIG. 5, $C\_SYS\_INT_{MASTER}$ and $C\_SYS\_INT_{SLAVE}$ are synchronized at time $T_5$.

One skilled in the art will appreciate that the synchronization method and system of the present invention is applicable to any digital system having multiple subsystems that require the subsystems to be synchronized. The synchronization method generates a synchronization signal in a master device that is then supplied as an input to one or more slave devices. The synchronization signal provides a mechanism by which the slave devices achieve identical and simultaneous phase alignment to the internally generated clock in the master device. Therefore, the synchronization method of the present invention allows one voltage-controlled oscillator to achieve synchronization for a plurality of subsystems without requiring a VCO for each subsystem.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A circuit for generating a synchronous clock in a plurality of subsystems, the circuit comprising:

a phase alignment circuit in a first subsystem out of the plurality of subsystems, the phase alignment circuit receiving an external system clock and producing a clocking signal having a frequency that is a multiple of the external system clock and phase aligned therewith, the phase alignment circuit further generating an internal clock that is phase aligned with the external system clock and generating a synchronization signal that marks a predefined edge of the internal clock; and a synchronization circuit in the other subsystems responsive to the synchronization pulse and the clocking signal and operative to generate a second internal clock that is synchronized with the internal clock in the first subsystem.

2. The circuit of claim 1, wherein the phase alignment circuit comprises:

a phase detector for determining a voltage difference signal between the external system clock and the internal clock;

a voltage-controlled oscillator (VCO) for generating an output signal by changing an oscillation frequency of the oscillator in accordance with a filtered phase difference signal; and a low-pass filter electrically coupled to the phase detector and the VCO, the low-pass filter receiving the voltage difference signal and producing the filtered phase difference signal.

3. The circuit of claim 1, wherein the synchronization circuit samples the synchronization signal with the clocking signal and upon detection of the marking for the predefined edge of the internal clock in the first subsystem waits a predetermined number of periods of the clocking signal before realigning a second internal clock signal to synchronize the second internal clock signal with the internal clock of the first subsystem.

4. The circuit of claim 1, wherein the clocking signal received at each of the other subsystems is phase aligned with the clocking signal at the first subsystem.

5. The circuit of claim 3, wherein the predetermined number of periods correlates to a frequency multiplier by which the clocking signal is a multiple of the external system clock.

6. A method for synchronizing multiple subsystems using one voltage-controlled oscillator, the method comprising:

transmitting a phase and frequency aligned output signal of a voltage-controlled oscillator to a plurality of subsystems within a digital system;

generating a first internal clock in a first subsystem of the plurality of subsystems;

outputting a synchronization signal from the first subsystem to each of the other subsystems in the digital system, the synchronization signal having a marker that defines a known point in time of the first internal clock;

receiving the synchronization signal at the other subsystems;

sampling the synchronization signal using the output signal of the voltage controlled oscillator received from the first subsystem to determine a starting indicator that indicates the known point in time of the first internal clock; and starting a second internal clock that is synchronized with the first internal clock upon detection of the marker in the synchronization signal.

7. The method of claim 6, wherein starting the second internal clock comprises waiting a predetermined number of periods of the output signal before realigning the second internal clock with the first internal clock.

8. The method of claim 7, wherein the predetermined number of periods correlates to a frequency multiplier by which the output signal is a multiple of an external reference signal.

* * * * *